US005976988A

United States Patent [19]

Konuma et al.

[11] Patent Number: 5,976,988

[45] Date of Patent: Nov. 2, 1999

[54] ETCHING MATERIAL AND ETCHING METHOD

[75] Inventors: Toshimitsu Konuma; Akira Sugawara; Takeshi Nishi, all of Kanagawa; Yukiko Uehara, Shizuoka; Satoshi Murakami; Misako Nakazawa, both of Kanagawa, all of Japan

[73] Assignee: Semiconductor Energy Laboratory Co., Ltd., Kanagawa-ken, Japan

[21] Appl. No.: 08/638,119

[22] Filed: Apr. 26, 1996

[30] Foreign Application Priority Data

| | | | |
|---|---|---|---|
| Apr. 26, 1995 | [JP] | Japan | 7-125910 |
| Apr. 28, 1995 | [JP] | Japan | 7-128923 |

[51] Int. Cl.[6] .......... H01L 21/302; C09K 13/00

[52] U.S. Cl. .......... 438/745; 438/756; 216/101; 216/104; 216/109; 252/79.3

[58] Field of Search .......... 438/745, 756; 216/101, 104, 109; 252/79.3, 79.4

[56] References Cited

U.S. PATENT DOCUMENTS

| | | | |
|---|---|---|---|
| 3,813,762 | 6/1974 | Kniepkamp | 29/589 |
| 4,087,367 | 5/1978 | Rioult et al. | 216/101 |
| 4,517,106 | 5/1985 | Hopkins et al. | 216/99 |
| 4,582,624 | 4/1986 | Enjo et al. | 216/99 |
| 4,761,244 | 8/1988 | Scardera et al. | 216/99 |
| 5,277,835 | 1/1994 | Ohmi et al. | 252/79.3 |

FOREIGN PATENT DOCUMENTS

| | | |
|---|---|---|
| 58-16534 | 1/1983 | Japan . |
| 49-79217 | 3/1992 | Japan . |

OTHER PUBLICATIONS

Shankoff, T.A. et al. "Controlling the interfacial oxide layerof Ti–Al contacts with the Cr03–H3P04 etch" J. Electrochem. Soc., vol. 125, No. 3, pp. 467–471 Mar. 1978.

*Primary Examiner*—R. Bruce Breneman
*Assistant Examiner*—Anita Alanko
*Attorney, Agent, or Firm*—Fish & Richardson P.C.

[57] ABSTRACT

An alumina film, a silicon oxide film, and a silicon nitride film formed on a substrate containing a large amount of alumina are etched by using an etching material in which the concentration of ammonium fluoride, which is a component of BHF, is set low. Etching is performed by using an etching material that is an aqueous solution produced by mixing hydrofluoric acid, ammonium fluoride and water at a weight ratio of x:y:(100−x−y) where x and y satisfy a relationship $y<-2x+10$ ($0<x\leqq5$, $0<y\leqq10$). 50% hydrofluoric acid on the market and 40% aqueous solution of ammonium fluoride are used.

12 Claims, 12 Drawing Sheets

ETCHING MATERIAL AND ETCHING METHOD

BACKGROUND OF THE INVENTION

1. Field of the Invention

The present invention relates to a method of removing an insulating film or a protective film formed on wirings in a producing method of forming semiconductor devices such as thin film transistors (TFTs) and thin film diodes (TFDs) on an insulating substrate such as a glass substrate or other various substrates, or of forming a thin film integrated circuit, particularly an active matrix liquid crystal display device, using such semiconductor devices.

2. Description of the Related Art

Liquid crystal display devices are used in many TV sets, word processors, etc. as thin and light weight display devices. In particular, active matrix liquid crystal display devices in which a thin film transistor (TFT) and other elements are formed at each display pixel by utilizing the producing technology of integrated circuits such as ICs and LSIs are expected as liquid crystal display devices capable of displaying superior images.

As the area of active matrix display devices using TFTs is increased, they are required to have small wiring resistance. The resistance of chromium (Cr) which has conventionally been used for a wiring is high. In general, when a low-temperature-processing polycrystalline silicon thin film, which is superior in high speed operation to an amorphous silicon thin film, is used as a semiconductor layer, since a producing process includes a doping process and a laser irradiation process, it is an important point whether gate electrode-wirings are sufficiently durable in such process.

Anodized aluminum is promising as a material that satisfies such conditions as low resistance and superior process durability.

FIGS. 1A–1D show a producing process for forming an electrode or wiring 11 containing mainly aluminum on a desired base member (object) such as an insulator, an insulating film, or a semiconductor.

In FIG. 1A, an electrode or wiring 11 containing mainly aluminum is formed on a base member 10 by sputtering, evaporation or the like. An oxidized aluminum layer (oxide layer) 12 is then formed on the aluminum surface by anodization in an electrolytic solution using the electrode or wiring 11 as an anode. The oxide layer 12 is used to improve a withstanding voltage or form offset gate regions of a TFT. In FIG. 1B, after the formation of the oxide layer 12, a silicon oxide or silicon nitride film is formed as an interlayer insulating film 13.

Since it is necessary to form a wiring for contact to the electrode or wiring 11, a hole portion 15 is formed by forming a desired mask 14 (usually a resist is used) and then etching a part of the electrode or wiring 11 with an etchant (etching material) such as buffer hydrofluoric acid (BHF), as shown in FIG. 1C. After the formation of the hole 15, the mask 14 is removed and a desired metal wiring 16 as a contact to the electrode or wiring 11 is deposited by evaporation or sputtering. (FIG. 1D).

Usually, an active matrix liquid crystal display device has a configuration in which a liquid crystal material is held between two glass substrates and TFTs are formed on one of the glass substrates. One of the conditions required for the substrate on which the TFTs are to be formed is a low degree of alkali metal dissolving. This is because if a substrate, such as a soda lime glass, containing a large amount of Na, K, etc. is used, alkali metals such as Na and K are dissolved during formation of a TFT substrate, so that the TFT characteristics are much deteriorated. For this reason, low alkali glass is generally used which contains a small amount of alkali metals.

Another condition is that contraction of a substrate which occurs after a heat treatment of the TFT substrate formation process is small. This is because if contraction of a substrate is large after a heat treatment, it becomes difficult to position alignment marks of a patterning mask in a subsequent photolithography process. In the photolithography process, a maximum allowable value of alignment mark deviation due to substrate contraction is 2 $\mu$m or less. This value corresponds to changes in 20 ppm and 4 ppm in the case of substrates of 100 mm square and 500 mm square, respectively. In a process of producing a TFT substrate, a heat treatment of 350° C. and 3 hours is needed for an amorphous silicon TFTs and a heat treatment of 600° C. and 4 hours is needed for low-temperature-processing polycrystalline silicon TFTs. Glass substrates satisfying the above conditions for such a heat treatment are needed.

Examples of glass materials that satisfy the conditions of (1) a low alkali content and (2) superior heat resistance and that are now used in active matrix liquid crystal display devices are #7059 and #1737 of Corning Glass Works and NA45 of Nippon Electric Glass Co., Ltd. In particular, #1737 is promising as a substrate having a small contraction amount after a heat treatment because it has a higher strain point than other glass materials. Although aluminum can be anodized easily, it is difficult to remove an aluminum oxide by etching.

Conventionally, etching removal of an aluminum oxide (i.e., alumina) film, is generally performed by using a phosphoric acid solution containing chromic acid anhydride. (See “Testing method of thickness of anodic oxide coatings of aluminum and aluminum alloys” of JIS H8680 and “Anodizing process standard of aluminum and aluminum alloys” of JIS H9500.) However, there remain many problems in terms of productivity, partly because chromic acid is a pollution-causing substance and therefore it requires cumbersome waste liquid processing.

Thus, as an alumina etching method not using chromic acid, there has been studied a method of using BHF in which 50%-hydrofluoric acid on the market and 40%-ammonium fluoride are mixed with each other at a ratio of 1:6 to 1:100 or BHF containing acetic acid (ABHF). BHF is usually used to etch a silicon oxide film etc. and ammonium fluoride is added to prevent resist peeling. However, the use of these etchants causes deposition of regular and rectangular crystals of 1 to 20 $\mu$m in size on an alumina surface. As a result, alumina in deposition portions is not etched at the same rate as that in the other portions, thereby leaving protrusions. This makes it difficult to form stable semiconductor circuits partly because of poor conditions of films formed thereon.

The use of BHF or ABHF causes deposition of regular and rectangular crystals of 1 to 20 $\mu$m in size on the surface of the above #1737 substrate, which is thereby clouded. However, when etching is performed with conventional BHF, this phenomenon is not found in the above #7059 substrate, which is commonly used as a substrate for low-temperature-processing TFTs.

To consider a cause of the above phenomenon, Table 1 shows compositions of #7059 and #1737.

TABLE 1

| Compositions of low alkali glass substrates (%) | | |
|---|---|---|
| | #7059 | #1737 |
| $SiO_2$ | 47.7 | 57.3 |
| BaO | 9.9 | 9.9 |
| $Al_2O_3$ | 11.7 | 16.7 |
| $B_2O_3$ | 13.3 | 7.6 |
| CaO | <0.1 | 4.2 |
| SrO | <0.1 | 1.8 |
| MgO | <0.1 | 0.7 |
| NaO | <0.1 | <0.1 |
| $Fe_2O_3$ | <0.1 | <0.1 |
| $K_2O$ | <0.1 | <0.1 |

As seen from Table 1, #1737 has a larger content of alumina ($Al_2O_3$) than #7059. Taking into consideration the fact that the similar phenomenon occurs in etching an alumina film, protrusions are considered to occur at portions containing a large amount of alumina.

No protrusions occur if DHF, which is produced by diluting hydrofluoric acid with pure water by a factor of 10 to 100, is used as an etchant instead of the above BHF. Since a ratio of an etching rate of DHF to alumina/aluminum of gate wiring is 1 to 2, it can sufficiently be used to form a contact hole by time control. However, it has been impossible to use DHF in a TFT substrate producing process because of resist peeling from a substrate during etching.

SUMMARY OF THE INVENTION

An object of the present invention is to provide an etchant for etching an aluminum oxide layer with high reproducibility, and which does not contain chromic acid (pollution-causing substance), is free of deposition of crystals on an alumina surface, and a photoresist sufficiently withstands etching.

Another object of the invention is to provide an etchant which does not cause the protrusions in etching a native oxide film, a silicon oxide film, a silicon nitride film, an alumina film or the like formed on a low alkali and highly heat resistant glass substrate. Thus, an etchant which enables production of stable TFTs with high reproducibility is provided.

In the present invention, alumina is etched by using an etching material in which the concentration of ammonium fluoride, which is a component of conventional BHF, is set low.

More specifically, in the invention, etching is performed by using an etching material produced by mixing hydrofluoric acid, ammonium fluoride, and pure water at a volume ratio of n:n:100 where n is 0.5 to 5. In weight %, hydrofluoric acid and ammonium fluoride are contained at 0.49 to 2.0% and 0.19 to 2.0%, respectively. In the invention, 50% hydrofluoric acid on the market and a 40% ammonium fluoride aqueous solution are used. A surface active agent may be contained in this solution.

According to the present invention, an alumina film, a silicon oxide film, and a silicon nitride film formed on a substrate containing a large amount of alumina are etched by using an etching material in which the concentration of ammonium fluoride, which is a component of conventional BHF, is set low.

More specifically, in the invention, etching is performed by using an etching material that is an aqueous solution produced by mixing hydrofluoric acid, ammonium fluoride and water at a weight ratio of x:y:(100−x−y) where x and y satisfy a relationship $$y<-2x+10(0<x\leqq 5,\ 0<y\leqq 10).$$

In the invention, 50% hydrofluoric acid on the market and 40% aqueous solution of ammonium fluoride are used. A surface active agent may be contained in this solution.

FIGS. 5A to 5G show a process of forming TFTs on a low alkali glass substrate having a large amount of alumina. In FIG. 5A, after a base oxide film 102 is formed on a substrate 101, active layers 103 to 105 are formed thereon. Then, a gate insulating film 106 made of silicon oxide or the like is formed. After gate electrodes 107 to 110 made of aluminum or the like are formed and etched, anodic oxide films are formed on those gate electrodes. The etchant can be used in separating gate lines and wirings for the anodization after the formation of the anodic oxide films. The etchant can also be used in forming contact holes in an interlayer insulating film made of silicon oxide, silicon nitride or the like. No deposition substances are found on the substrate surface when the above etchant is used.

By using the etchant for alumina in which the concentration of ammonium fluoride, which is a component of conventional BHF, is set low, selective etching can be performed in the room temperature. In this state, a ratio of an etching rate of alumina to that of aluminum is to 1 to 3.

FIG. 4 shows a range of the mixing ratio between hydrofluoric acid and ammonium fluoride which enables superior etching and a range where resist peeling occurs or deposition substances are formed on a substrate. In the above etchant, if the concentration of ammonium fluoride becomes higher than the above range, the concentration ratio of water to the entire etchant becomes low. Since reaction products of alumina (or aluminum) due to ammonium fluoride has a low solubility with respect to water, they necessarily deposit as rectangular crystals. If the concentration of ammonium fluoride is lower than the above range, the etchant may cause peeling of a photoresist. Thus, the etchant in the above range is suitable to etch alumina, an etching surface can be improved in flatness.

FIG. 12 shows a range in weight % of the mixing ratio between hydrofluoric acid and ammonium fluoride which enables superior etching and a range where deposition substances are formed on a substrate in the case of etching alumina and the like formed on a substrate containing a large amount of alumina with an etchant that is an aqueous solution of hydrofluoric acid and ammonium fluoride. That is, FIG. 12 shows ranges where deposition substances are formed and not formed, in which the horizontal and vertical axes represent proportions of hydrofluoric acid and ammonium fluoride in the aqueous solution (the entire solution: 100 weight %). It is considered that the formation of deposition substances described in the invention is influenced by the rate of formation of reaction products of alumina (or aluminum) due to aluminum fluoride and their solubility with respect to water.

In the hatched range of FIG. 12, the solvency is dominant rather than the tendency of forming reaction products, and such range is thus suitable for etching and capable of improving the flatness of an etching surface. In the other range, since the tendency of forming reaction products is considered to be dominant, reaction products may be formed as the deposition substances.

DETAILED DESCRIPTION OF THE PREFERRED EMBODIMENTS

Embodiment 1

Figure 1A:
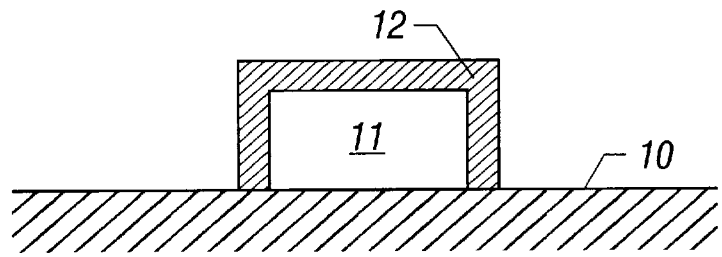
FIGS. 1A to 1D show a state of wirings using aluminum in a conventional case.
Figure 1B:
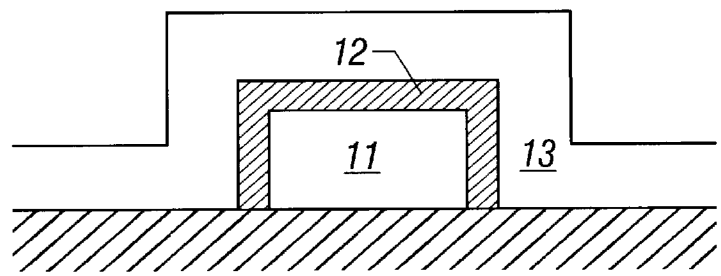
Figure 1C:
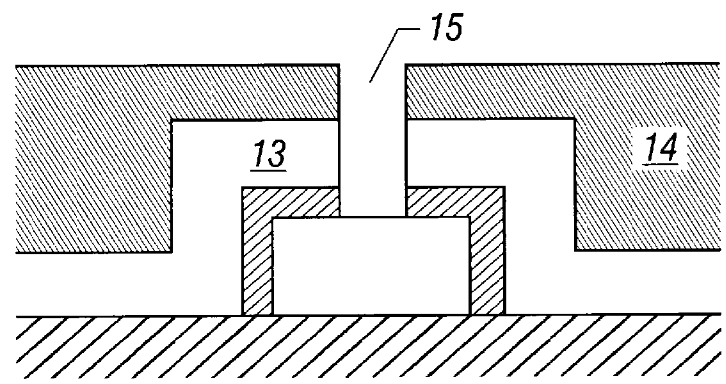
Figure 1D:
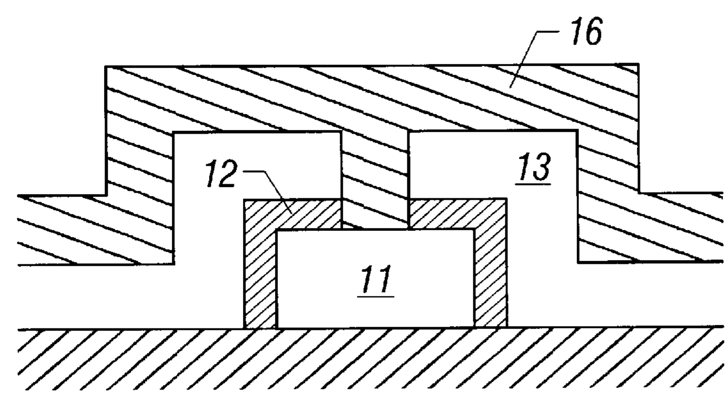
Figure 2A:
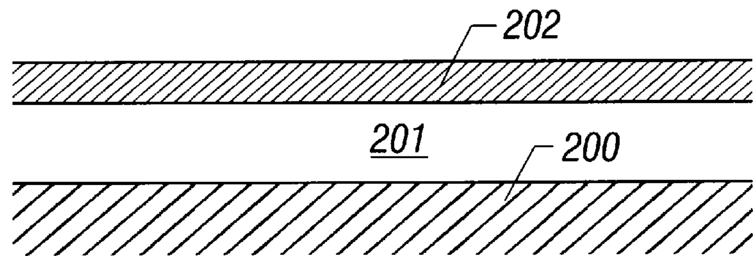
FIGS. 2A to 2D show a producing process of a gate wiring according to an embodiment of the present invention.

An embodiment of the present invention will be described in which a gate electrode is formed on a glass substrate. As shown in FIG. 2A, a 4,000-Å-thick film 201 containing mainly aluminum is formed on a glass substrate 200 by evaporation or the like. To prevent hillocks, the film 201 contains Sc at 0.2%.

An oxide layer 202 of about 140 Å in thickness is formed by anodization in an electrolyte using the aluminum film 201 as an anode. In this process, the electrolyte is produced by neutralizing ethylene glycol solution containing tartaric acid at 3% with aqueous ammonia, and a voltage of 10 V is applied.

Figure 2B:
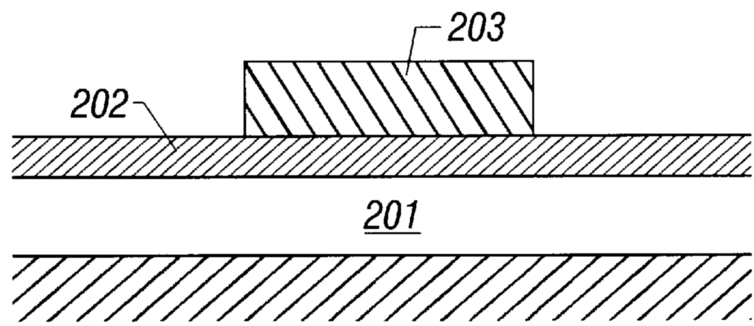
Figure 2C:
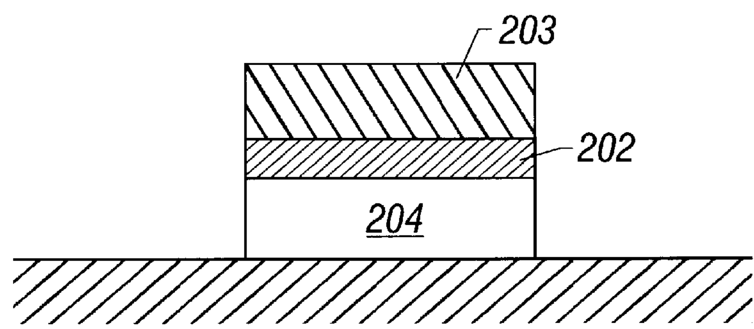

After a photoresist 203 is formed as a mask (FIG. 2B), a gate electrode 204 is formed by etching using etchants described below (FIG. 2C). The oxide layer 202 and the aluminum film 201 are etched with different etchants.

An etchant for the oxide layer 202 is a solution produced by mixing hydrofluoric acid, ammonium fluoride, and pure water at a volume ratio of 3:2:150 (hydrofluoric acid and ammonium fluoride are contained at 0.968% and 0.516%, respectively, in weight % in the etchant). The etching time is 11 seconds at the room temperature (22° C.), and 30% overetching is performed. By using the etchant having the above mixing ratio, no deposition substances are found on the alumina surface when the substrate surface is observed with a microscope.

Figure 2D:
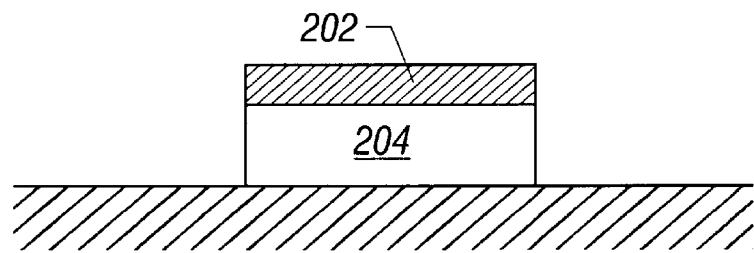

The aluminum film 201 is etched with an etchant that is a solution containing mainly phosphoric acid, acetic acid, and nitric acid. The solution containing phosphoric acid at 72%, acetic acid at 2%, nitric acid at 9 to 10% (each in volume %) and the other constituent of pure water is heated to 35° C. The etching time is 90 seconds. Thus, the gate electrode 204 having the oxide layer 202 on its upper portion is formed, and a smooth surface free of any deposition substances is obtained in the remaining area. (FIG. 2D).

This embodiment can similarly be used for a gate aluminum separating process.

Embodiment 2

Figure 3A:
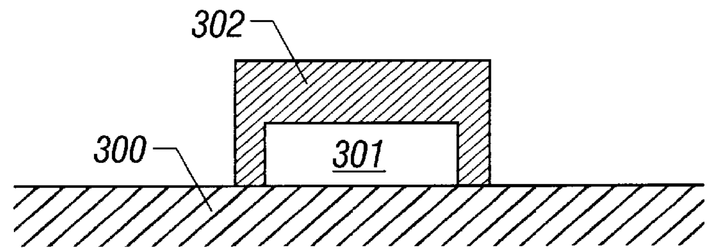
FIGS. 3A to 3D show a producing process of a contact hole for a gate according to an embodiment.

An embodiment of the invention for forming a contact to a gate electrode provided on a glass substrate will be described. In FIG. 3A, an aluminum gate electrode 301 is formed on a glass substrate 300 in the same manner as in the first embodiment. An oxide layer 302 is formed at a thickness of 1,700 Å. The thickness of the gate electrode 301 obtained after the formation of the oxide layer 302 is 3,000 Å.

Figure 3B:
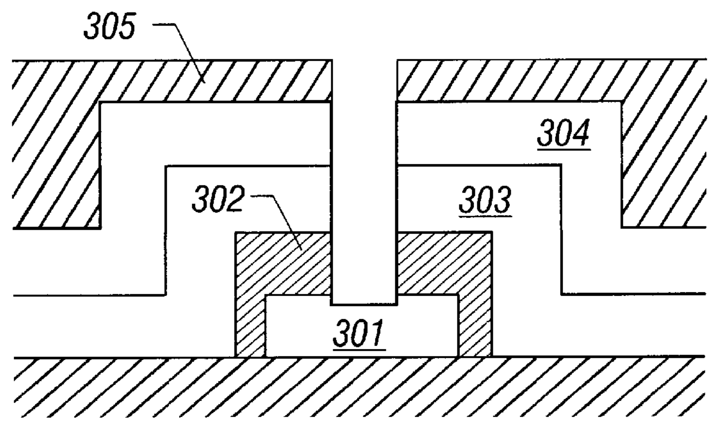

A 500-Å-thick silicon nitride film 303 and a 9,000-Å-thick silicon oxide film 304 as interlayer insulating films are then formed by sputtering or evaporation (FIG. 3B).

Figure 3C:
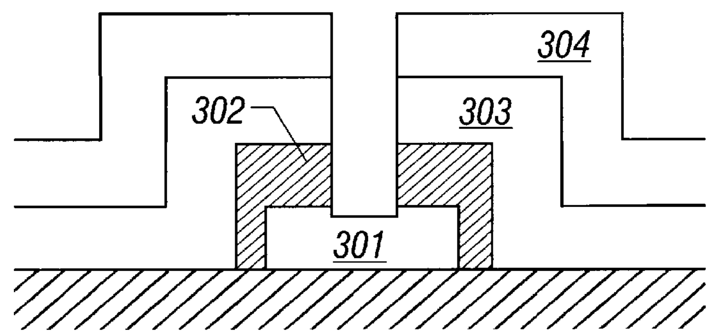

After a photoresist 305 is formed as a mask, the interlayer insulating films 303 and 304 and the oxide layer 302 are etched with etchants described below (FIG. 3C). The films 303 and 304 and the layer 302 are etched with different etchants.

The etchant used to etch the interlayer insulating films 303 and 304 is LL 10:1 (produced by Hashimoto Kasei Co., Ltd.; containing a surface active agent). The etching time is 5 minutes and 45 seconds.

An etchant used to etch the oxide layer 302 is a solution produced by mixing hydrofluoric acid, ammonium fluoride, and pure water at a volume ratio of 3:2:150 (in weight % in the etchant, hydrofluoric acid and ammonium fluoride are contained at 0.968% and 0.516%, respectively). The etching time is 2 minutes and 33 seconds at the room temperature (22° C.), and 20% overetching is performed. By using the etchant having the above mixing ratio, the oxide layer 302 is etched. In FIG. 3C, a surface of the gate electrode 301 is slightly etched in this etching process (etching depth: 500 Å).

After the photoresist 305 is peeled, in order to form a contact to the gate electrode 301 of aluminum, a 500-Å-thick titanium film 306 and a 8,000-Å-thick film 307 mainly made of aluminum and containing Si at 2% are formed by sputtering or evaporation and then patterned by etching by a known method or a desired method.

The film 306 and the film 307 mainly made of aluminum are etched with different etchants. To etch the titanium film 306, an etchant that is a solution produced by mixing hydrogen peroxide, ammonia, and pure water at a volume ratio of 5:2:2 is heated to 40° C. The etching time is 10 seconds.

To etch the film 307, an etchant containing mainly phosphoric acid, acetic acid, and nitric acid is used. More specifically, a solution containing phosphoric acid at 72%, acetic acid at 2%, nitric acid at 9 to 10% (each in volume %), and the other constituent of pure water is heated to 35° C. The etching time is 3 minutes.

Figure 3D:
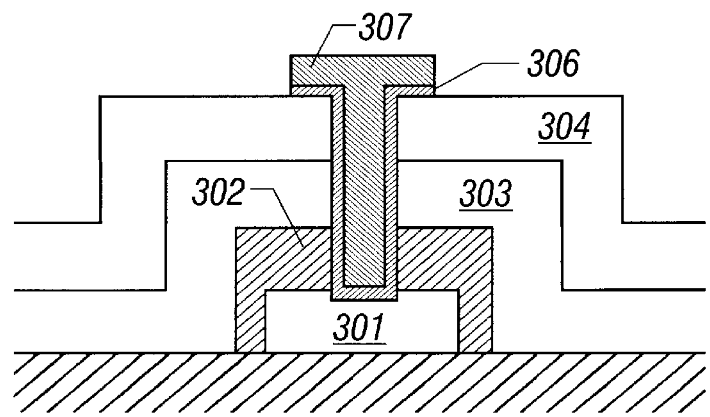
Figure 4:
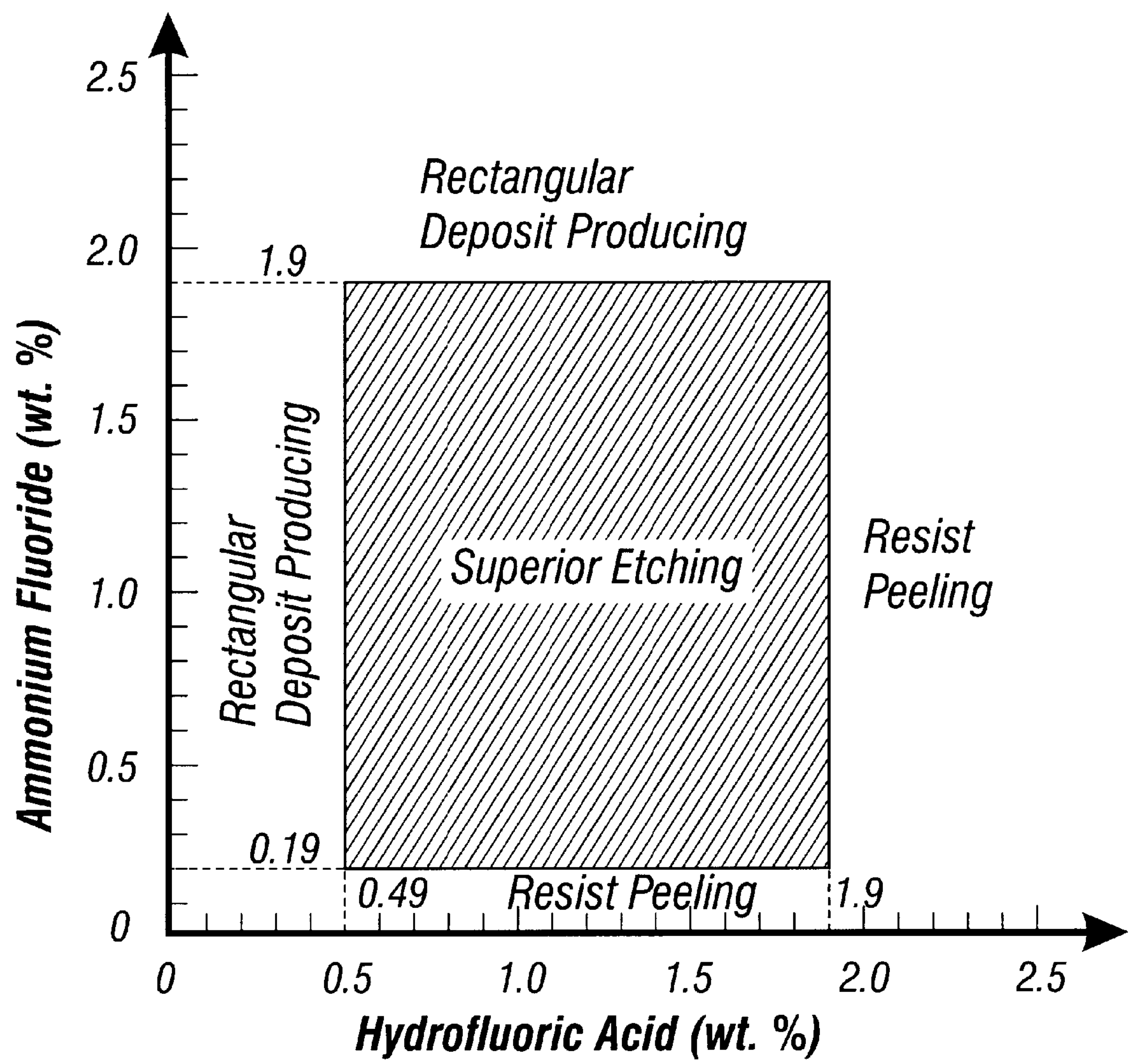
FIG. 4 shows the dependence of a mixing ratio between hydrofluoric acid and ammonium fluoride in an alumina etching state.

Thus, in FIG. 3D, superior contact is obtained between the gate electrode 301 and the aluminum wiring 307.

Embodiment 3

Figure 7A:
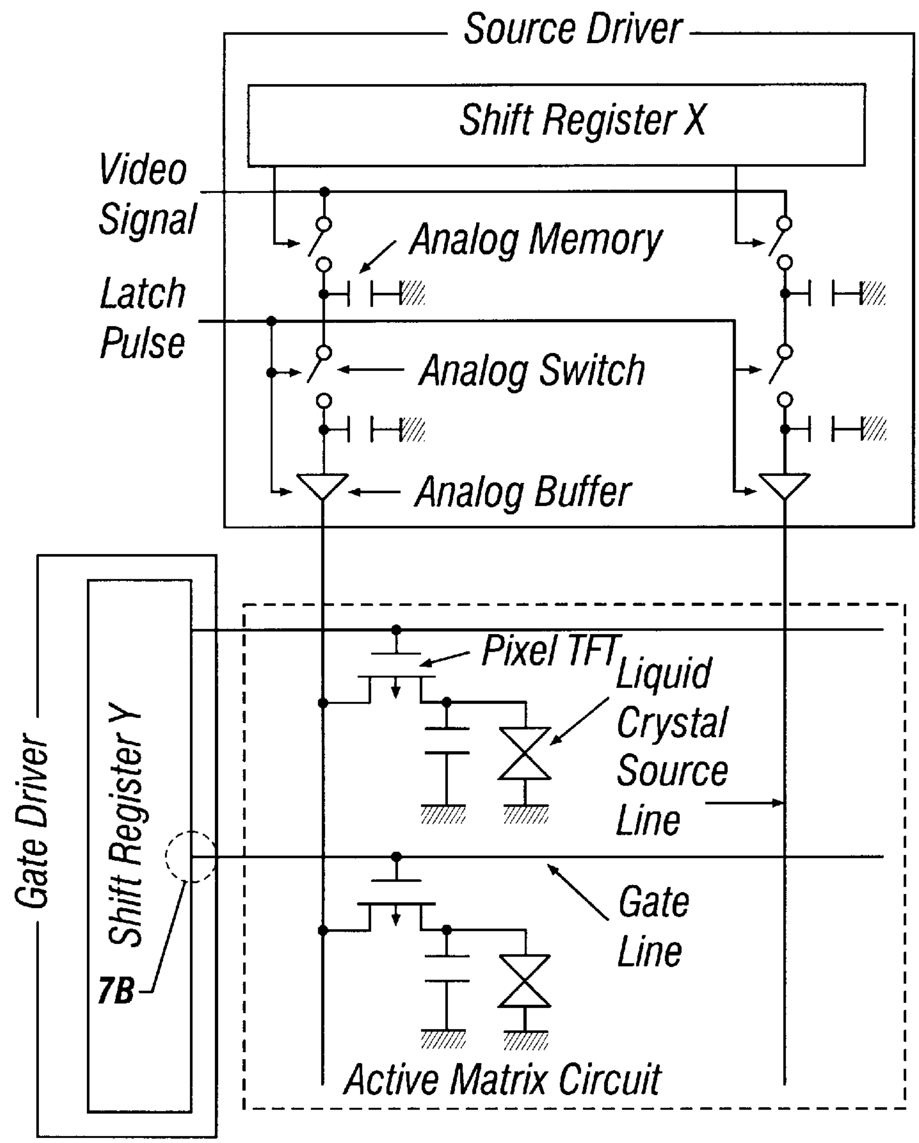
FIG. 7 shows a liquid crystal display using a monolithic active matrix circuit.
Figure 7B:
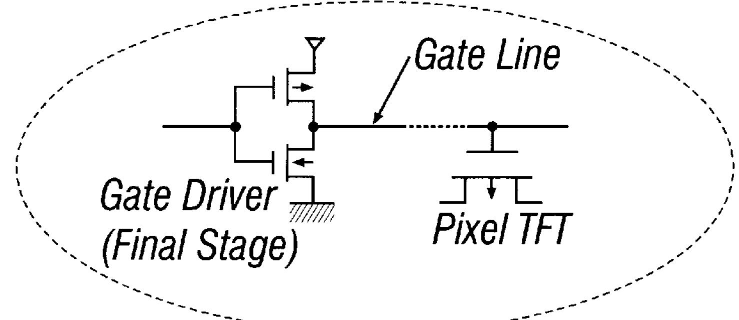
Figure 8A:
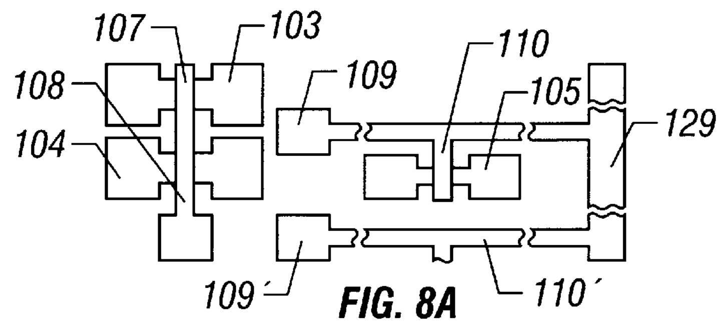
FIGS. 8A to 8E show a producing process according to an embodiment.
Figure 8B:
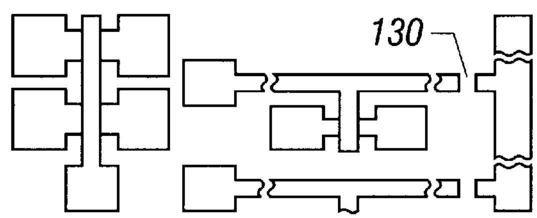
Figure 8C:
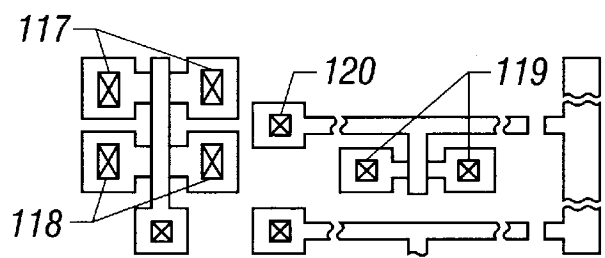
Figure 8D:
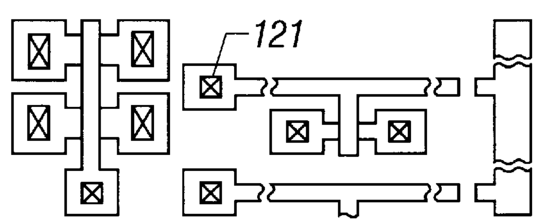
Figure 8E:
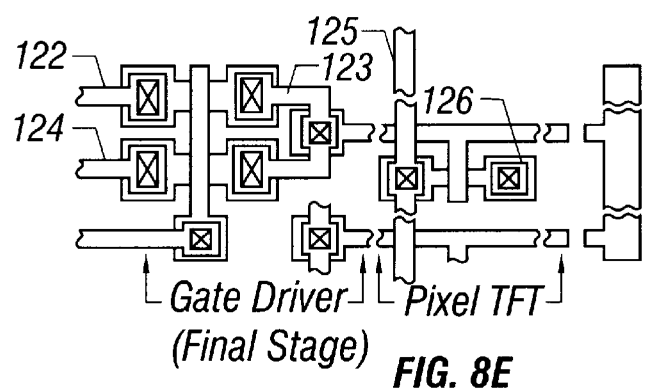
Figure 9A:
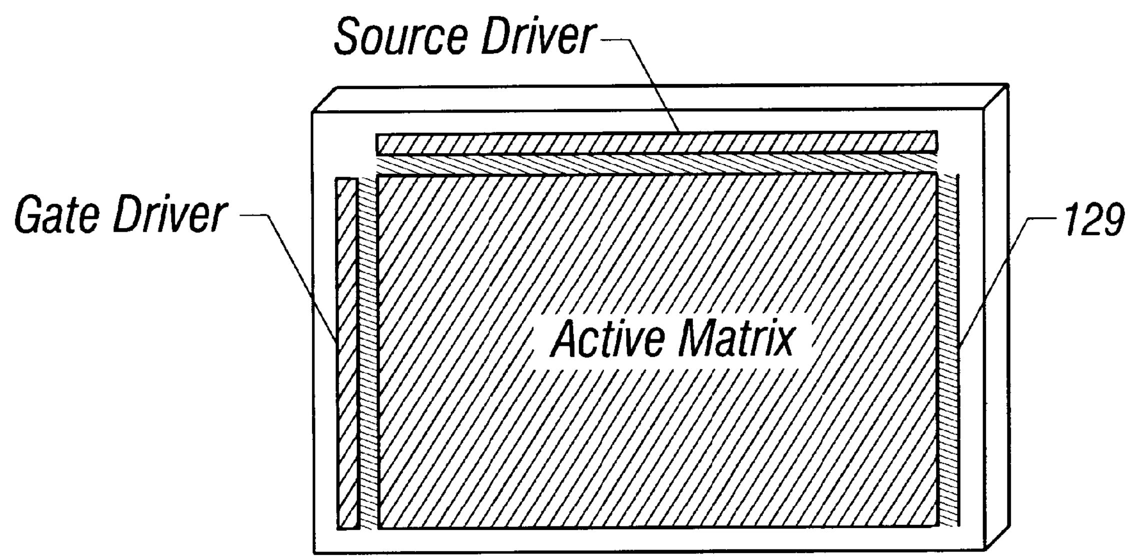
FIGS. 9A and 9B show a schematic view of an monolithic type active matrix circuit and an anodization method.

An embodiment will be described with reference to FIGS. 5A to 5G, 7, 8A to 8E, and 9A to 9B. This embodiment relates to a liquid crystal display using a monolithic active matrix circuit having a structure of FIG. 7. FIGS. 5A to 5G and 8A to 8E mainly show boundary portions between a gate driver and gate lines and pixel TFT portions. In FIG. 7, CMOS inverters as buffers are provided at the final stage of the gate driver. This is not limited to this example: in general, gate lines are not connected to gate electrodes, but are connected to source/drain regions of TFTs provided at the final stage of a gate driver. FIG. 9A shows a general configuration of the active matrix circuit of this embodiment.

A producing process of the monolithic active matrix circuit of this embodiment will be described with reference to FIGS. 5A to 5G and 8A to 8E. To reduce thermal contraction of a substrate (Corning #1737, 100 mm×100 mm×1.1 mm in thickness) 101 during the producing process, it is thermally annealed at 710 ° C. for 4 hours. The thermal annealing contracts the substrate 101 by 1,300 ppm. A base oxide film (as silicon oxide film) 102 of 1,000 to 3,000 Å in thickness is formed on the substrate 101 by sputtering or plasma CVD in an atmosphere containing oxygen.

Then, an amorphous or crystalline silicon film having a thickness of 300 to 1,500 Å, preferably 500 to 1,000 Å, is formed by plasma CVD or LPCVD. A crystalline silicon film may be obtained by forming an amorphous silicon film and then irradiating it with laser light or intense light equivalent to it (optical annealing) or performing long-time thermal annealing at 500° C. or higher. Also, a silicon film crystallized by thermal annealing may further be optically annealed, to enhance its crystallinity. As disclosed in Japanese Patent Application Open Nos. 6-244103 and 6-244104, a catalyst element such as nickel for promoting crystallization of silicon may be added in crystallization by thermal annealing. In the embodiment, this thermal annealing contracts the substrate 101 by 10 ppm; this causes no problems in a subsequent alignment process.

TFT active layers 103 and 104 of the peripheral driver circuit and a TFT active layer 105 of the matrix circuit are then formed by etching the silicon film. A silicon oxide gate insulating film 106 of 500 to 2,000 Å in thickness is formed thereon by sputtering in an atmosphere containing oxygen. It may be formed by plasma CVD.

Figure 5A:
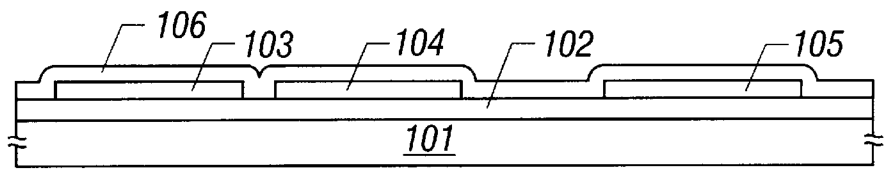
FIGS. 5A to 5G show a process of forming TFTs on a low alkali glass substrate having a large amount of alumina.

In the invention, it is preferred that the gate insulating film 101 has a sufficiently high withstanding voltage, because a high voltage (electric field) is applied between gate electrodes and silicon active layers during anodization. When the gate insulating film is formed by using a silicon oxide film produced by plasma CVD, it is preferable to use, as raw gases, monosilane ($SiH_4$) and dinitrogen monoxide ($N_2O$) or oxygen ($O_2$). (FIG. 5A).

Figure 5B:
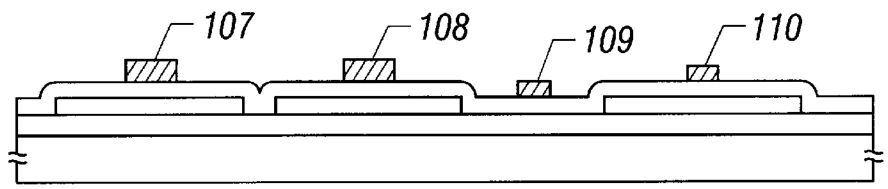

An aluminum film (containing scandium at 0.1 to 0.5 weight %) having a thickness of 2,000 Å to 5 μm, preferably 2,000 to 6,000 Å, is formed by sputtering over the entire substrate surface. By etching this aluminum film, gate electrodes or gate lines 107, 108, 109 (109') and 110 (110') and a wiring 129 for anodization are formed. The gate lines 109 (109') are so designed as to be connected to the wiring 129 for anodization. The gate electrodes 107 and 108 of the peripheral driver circuit are so designed as to be electrically insulated from the wiring (power supply line) 129 for anodization. (FIGS. 5B and 8A).

The substrate is immersed in an electrolyte and a current is caused to flow through the wiring 129, to anodize the gate line 109 (109') and the gate electrode 110 (110'). The electrolyte is produced by neutralizing an ethylene glycol solution containing tartaric acid at 3% with aqueous ammonia.

Figure 9B:
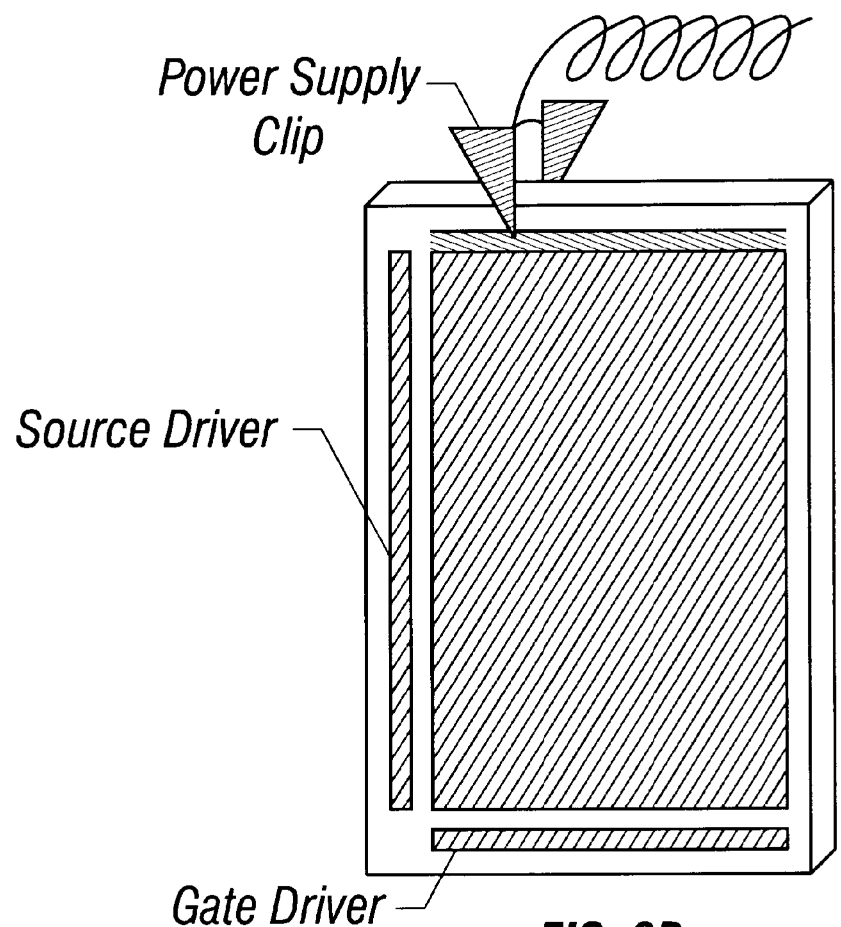

In the anodization, in FIG. 9B, a current is supplied by gripping the wiring 129 with a power supply clip such as a crocodile-mouth-shaped clip. Thus, anodic oxide films 111 and 112 are formed on upper and side surfaces of the gate line 109 (109') and the gate electrode 110 (110') that are connected to the wiring 129 for anodization. An applying voltage is 120 V and the thickness of the anodic oxide films 111 and 112 is 1,700 Å.

Figure 5C:
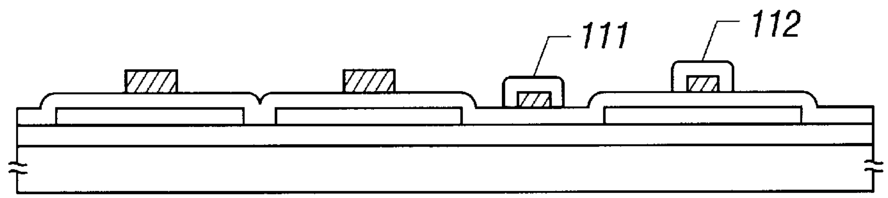

An anodic oxide obtained by anodization with a substantially neutral solution as in this embodiment is dense and hard and has a high withstanding voltage which is 70% or higher of the maximum voltage applied during anodization. This type of anodic oxide is called "barrier type anodic oxide." (FIG. 5C)

A resist is formed to allow etching of only the boundaries between the gate lines and the wiring 129, and etching for separation is performed using an etchant that is a solution produced by mixing hydrofluoric acid, ammonium fluoride, and pure water at a volume ratio of 3:2:100 (in weight % in the etchant, hydrofluoric acid and ammonium fluoride are contained at 0.968% and 0.516%, respectively). The etching time is 11 seconds at the room temperature (22° C.), and 30% overetching is performed. By using the etchant having the above mixing ratio, no deposition substances are found on the substrate and alumina surfaces when the substrate is observed with a microscope. The gate lines and the wiring 129 are separated from each other by grooves 130 formed by the etching. (FIG. 8B)

Figure 5D:
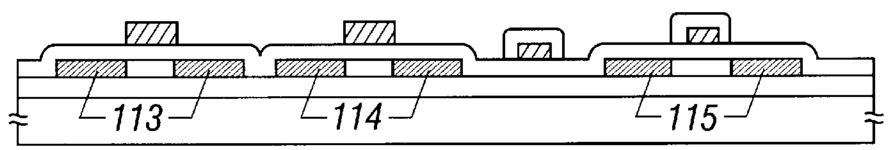

Impurities are implanted into the island-like silicon films of the respective TFTs by ion doping using the gate electrode portions (the gate electrodes and the anodic oxide films around those) as masks. That is, phosphorus is implanted into all of the island-like regions by using phosphine ($PH_3$) as a doping gas, and then boron is implanted into the island-like regions 104 and 105 by using diborane ($B_2H_6$) as a doping gas while only the island region 103 is covered with a photoresist. Doses of phosphorus and boron are respectively $4\times10^{14}$ to $4\times10^{15}$ atoms/cm$^2$ and 1 to $8\times10^{15}$ atoms/cm$^2$, so that the dose of boron is higher than that of phosphorus. Thus, an N-type region 113 and P-type regions 114 and 115 are formed. (FIG. 5D)

A KrF excimer laser light (wavelength: 248 nm; pulse width: 20 nsec) is irradiated, so that the crystallinity is improved in the portions where the crystallinity had been degraded by introducing the impurities: the N-type region 113 and the P-type regions 114 and 115 are activated. The laser energy density is 200 to 400 mJ/cm$^2$, preferably 250 to 300 mJ/cm$^2$. A sheet resistance of the regions 113 to 115 is 200 to 800 Ω/square.

Figure 5E:
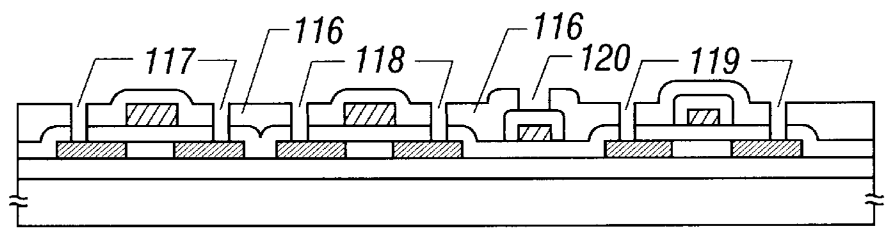

A multilayer film of a 500-Å-thick silicon nitride film and a 9,000-Å-thick silicon oxide film is formed over the entire surface by plasma CVD as an interlayer insulating film 116. The interlayer insulating film 116 is etched by wet etching with an etchant of LL 10:1 (produced by Hashimoto Kasei Co., Ltd.; containing a surface active agent). The etching time is 5 minutes and 45 seconds. Thus, contact holes 117 to 119 are formed in the N-type region 113 and the P-type regions 114 and 115. A hole 120 is formed in the gate electrode and gate line at the same time. However, at this stage the contact hole 120 does not reach the gate line because the anodic oxide film 111 serves as a barrier and etching is stopped. (FIGS. 5E and 8C).

Figure 5F:
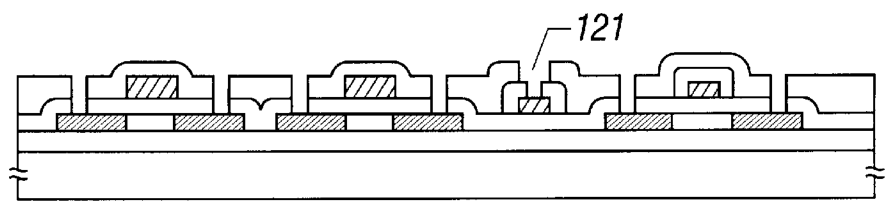

A contact hole 121 is formed by forming a contact hole pattern by photolithography in the hole 120 formed in the above process, and then etching using an etchant having the same composition as that used in the above etching for separation. The etching time is 2 minutes and 33 seconds and 20% overetching is performed. (FIGS. 5F and 8D).

Then, a titanium film of 500 to 1,000 Å in thickness and an aluminum film of 6,000 to 8,000 Å in thickness are formed in turn by sputtering. The aluminum film contains scandium at 2% to prevent hillocks. These films are etched first with ammonia hydrogen peroxide ((hydrogen peroxide):ammonia:water=5:2:2) at 40° C. for 10 seconds, and then etched with an aluminum mixed acid (phosphoric acid, acetic acid and nitric acid) at 35° C., so that electrode-wirings 122 to 124 and a source line 125 of the peripheral driver circuit and an electrode 126 of a pixel TFT are formed. The wiring 123 is formed to be connected to the gate line 109. (FIG. 8E).

Figure 5G:
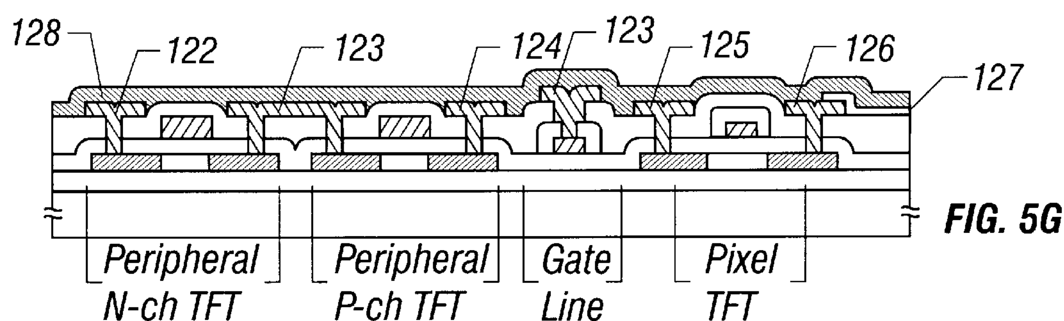

A pixel electrode 127 is formed by etching an ITO (indium tin oxide) film at a thickness of 500 to 1,500 Å which is formed by sputtering. Finally, a silicon nitride film 128 as a passivation film is formed at a thickness of 1,000 to 3,000 Å by plasma CVD. Thus, the peripheral logic circuit and the active matrix circuit are formed in an integral manner. (FIG. 5G).

Embodiment 4

A fourth embodiment is also directed to a monolithic active matrix circuit for a liquid crystal display. FIGS. 6A to 6G show a producing process according to this embodiment. FIGS. 7, 8A to 8E, and 9A to 9B may be referenced for a circuit configuration etc. of this embodiment. Although this embodiment employs CMOS circuits in the peripheral circuit, FIGS. 6A to 6G show only an NTFT as a TFT of the peripheral circuit to simplify the description. FIGS. 6A to 6G show, in a representative manner, the peripheral logic circuit on the left side and the matrix circuit on the right side.

As in the third embodiment, a Corning #1737 glass substrate is used as a glass substrate 401. First, as in the third embodiment, the glass substrate 401 is thermally annealed at 710° C. for 4 hours. A 2,000-Å-thick base silicon oxide film 402 is then formed on the glass substrate 401 by plasma CVD. Monosilane ($SiH_4$) and dinitrogen monoxide ($N_2O$) are used as raw gases of the plasma CVD. The substrate temperature during the film formation is 380 to 500° C., e.g., 430° C. The silicon oxide film formed in this manner is a hard film with a relatively low etching rate. This is because, by using dinitrogen monoxide as a raw gas, the formed film is a silicon oxynitride film containing nitrogen at 1 to 10%. As a typical etching rate, when etching is performed at 23° C. with an etchant having the same composition as the etchant used in the third embodiment for the etching for separation, an etching rate is 200 to 600 Å/minute.

Then, a 500-Å-thick amorphous silicon film is formed by plasma CVD. A very thin silicon oxide film (estimated to be 40 to 100 Å) is formed on the surface of the amorphous silicon film by thermal annealing at 550° C. for 1 hour in an oxidizing atmosphere. A very thin nickel acetate film is formed thereon by spin coating by using a 1-to-100-ppm nickel acetate aqueous solution. The reason why the very thin silicon oxide film is previously formed on the surface of the amorphous silicon film is to allow the aqueous solution to uniformly apply over the surface of the amorphous silicon film.

Thermal annealing is performed at 550° C. for 4 hours in an atmosphere containing nitrogen. Nickel acetate is decomposed to produce nickel at about 400° C. Since the nickel acetate thin film is substantially in close contact with the amorphous silicon film, nickel enters the amorphous silicon film during the thermal annealing and crystallizes it, to become a crystalline silicon region.

The silicon film is then irradiated with XeCl excimer laser light (wavelength: 308 nm). The energy density of the laser is 250 to 300 mJ/cm$^2$. As a result, the crystallinity of the crystalline silicon film is further improved.

To reduce stress strain caused by the laser irradiation, thermal annealing is again performed at 550° C. for 4 hours.

Then, island-like active layers 403 and 404 are formed by etching the silicon film, and a 1,200-Å-thick silicon oxide film 405 as a gate insulating film is formed thereon by sputtering.

A 4,000-Å-thick aluminum film (containing scandium at 0.2 to 0.3 weight %) is formed thereon by sputtering. An aluminum oxide film (not shown) of 100 to 300 Å in thickness is formed by anodizing the surface of the aluminum film with application of a voltage of 10 V in an electrolyte produced by neutralizing an ethylene glycol solution containing tartaric acid at 3% with aqueous ammonia. The aluminum oxide film not only provides good adhesiveness between the aluminum film and a photoresist, but also is effective in forming porous anodic oxide films only on the side surfaces of gate electrodes in a subsequent anodization process by suppressing current leak via the photoresist.

Figure 6A:
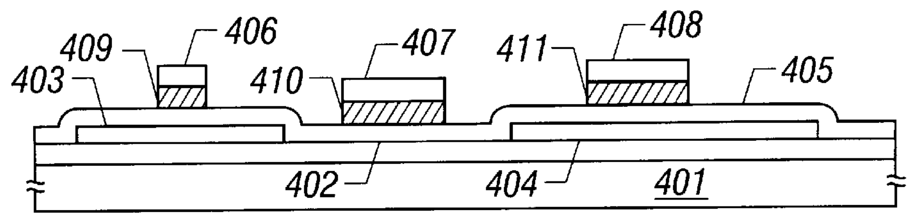
FIGS. 6A to 6G show a producing process according to an embodiment.

A photoresist (for instance, OFPR 800/30cp produced by Tokyo Ohka Kogyo Co., Ltd.) is formed by spin coating. Gate electrodes 409 and 411 and a gate line 410 are formed by patterning and etching. The gate electrode 409 of the peripheral circuit is electrically insulated from the gate line 410 and the gate electrode 411 of the matrix circuit. Photoresist masks 406 to 408 used for the etching are left as they are. (FIG. 6A)

Porous type anodization is performed by causing a current to flow through the gate line 410 (that is, the gate electrode 411) with the photoresist masks 406 to 408 left as they are, so that porous anodic oxide films 412 and 413 are formed on the side surfaces of the gate line 410 and the gate electrode 411, respectively. The anodization may be performed using an acid solution containing citric acid, oxalic acid, phosphoric acid, chromic acid, sulfuric acid or the like at 2 to 20% with a voltage of 10 to 30 V applied to the gate electrode 411.

Figure 6B:
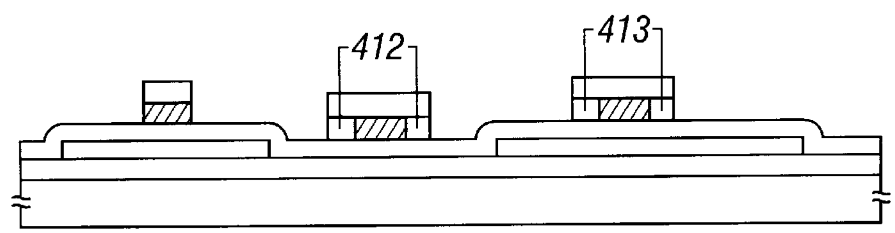

In this embodiment, the anodization is performed for 20 to 40 minutes in an oxalic acid solution (30° C.) of pH=0.9 to 1.0 with application of a voltage of 10 V. The thickness of the anodic oxide films is adjusted by the anodization time. A porous anodic oxide is formed by anodization using the above acid solution. The thickness of the porous anodic oxide films 412 and 413 is 3,000 to 10,000 Å, e.g., 5,000 Å. (FIG. 6B).

Figure 6C:
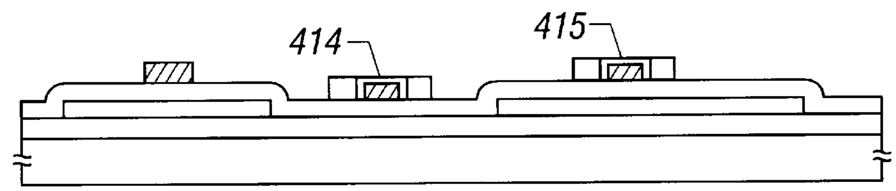

After the photoresist masks 406 to 408 are removed, barrier type anodization is performed by causing a current to flow through the gate line 410 in the same manner as in the third embodiment, so that 1,200-Å-thick dense, barrier type anodic oxide films 414 and 415 are formed on the upper and side surfaces of the gate line 410 and the gate electrode 411. (FIG. 6C).

Figure 6D:
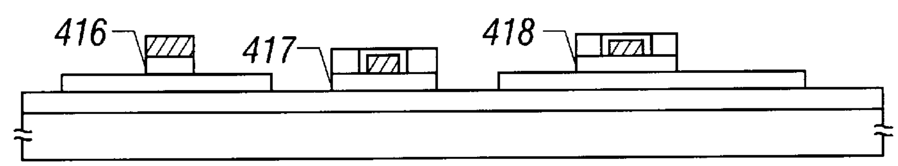

Gate insulating films 417 and 418 are then formed by etching the silicon oxide film 405 by dry etching using the porous anodic oxide films 412 and 413 as masks. This etching may be either of a plasma mode (isotropic etching) or of a reactive ion etching mode (anisotropic etching). However, it is important not to excessively etch the active layers by providing a large selection ratio of silicon oxide to silicon. If $CF_4$ is used as an etching gas, only the silicon oxide film 405 is etched while the anodic oxide films are not etched. The silicon oxide films 417 and 418 under the porous anodic oxide films 412 and 413 are left, that is, not etched. (FIG. 6D).

Thereafter, only the porous anodic oxide films 412 and 413 are etched by using a mixed solution of phosphoric acid, acetic acid, and nitric acid (aluminum mixed acid). While the aluminum mixed acid etches the porous anodic oxide films 412 and 413, it hardly etches the barrier type anodic oxide films 414 and 415. However, since it etches aluminum, the peripheral circuit portions are masked with a photoresist to protect the gate electrodes in those portions. Thus, one photolithography process is additionally needed as compared with the third embodiment. However, like the third embodiment, this embodiment is advantageous in that the degree of integration can be increased in the peripheral circuit portions.

By using the gate insulating films 416 and 418, impurities (phosphorus and boron; although only the NMOS TFT is shown in the figures, boron doping is actually performed) are implanted into the active layers 403 and 406 by ion doping. As for the phosphorus doping, first, phosphorus ions are implanted a relatively high dose of $5\times10^{14}$ to $5\times10^{15}$ atoms/cm$^2$ using a relatively low acceleration voltage of 10 to 30 keV. Since ion implantation is shallow due to the low acceleration voltage, phosphorus is mainly introduced into regions 419 and 420 where silicon is exposed.

Then, phosphorus ions are implanted at a relatively low dose of $1\times10^{12}$ to $1\times10^{14}$ atoms/cm$^2$ using a relatively high acceleration voltage of 60 to 95 keV. Since ion implantation is deep due to the high acceleration voltage, phosphorus is also introduced into regions 421 covered with the gate insulating film 418.

Figure 6E:
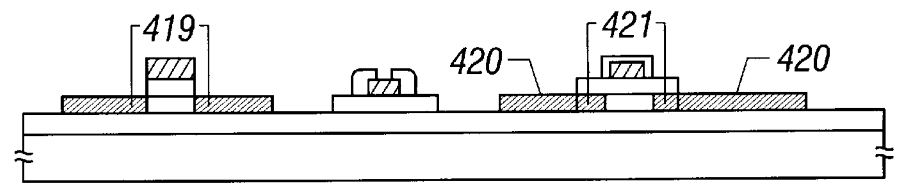
Figure 6F:
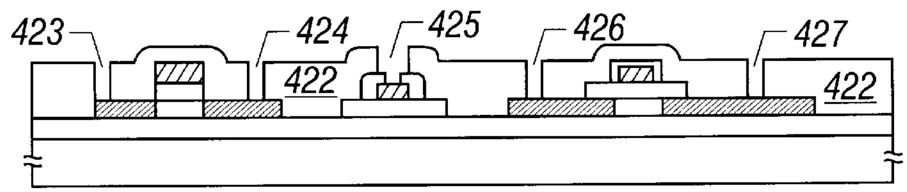

Thus, there are formed the regions 419 and 420 doped with phosphorus at a high concentration and the region 421 doped with phosphorus at a low concentration. That is, the pixel TFT is given what is called a double drain structure. The boron doping may be performed in a similar manner. As for impurity activation after the doping, laser annealing is performed in the same manner as in the third embodiment. (FIG. 6E).

Then, a multilayer film 422 of a 200-Å-thick silicon oxide film and a 4,000-Å-thick silicon nitride film is deposited as a first interlayer insulator by plasma CVD. Contact holes 423 to 427 are formed by etching the multilayer film 422 with an etchant having the same composition as the etchant used in the third embodiment for the etching for separation. (FIG. 6F) No deposition substances are found on the substrate surface during the etching.

A three-layer metal film of a 500-Å-thick titanium film, a 4,000-Å-thick aluminum film, and a 500-Å-thick titanium film is formed by sputtering, and then etched to form electrodes-wirings 428 to 431.

Figure 6G:
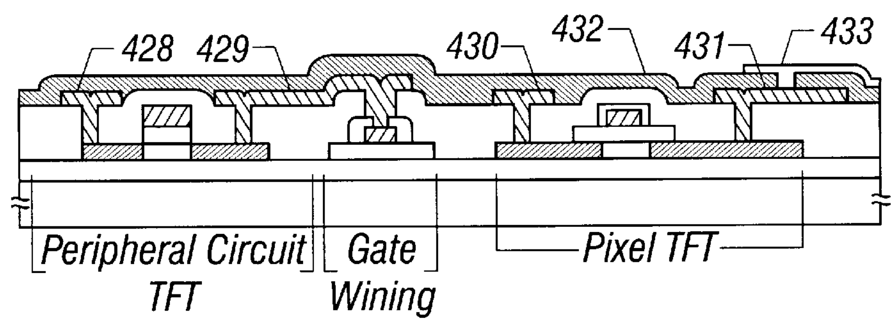

A 2,000-Å-thick silicon oxide film 432 (as a second interlayer insulating film) is formed by plasma CVD. After a contact hole for the drain side electrode 431 of the pixel TFT is formed, a pixel electrode 433 made of ITO is formed. Thus, a monolithic active matrix circuit can be completed. (FIG. 6G).

Embodiment 5

A fifth embodiment is also directed to a monolithic active matrix circuit for a liquid crystal display. FIGS. 10A to 10F and 11A to 11E are sectional views and top views, respectively, of a producing process according to this embodiment. FIGS. 10A to 10F show the peripheral logic circuit on the left side and the matrix circuit on the right side.

Figure 10A:
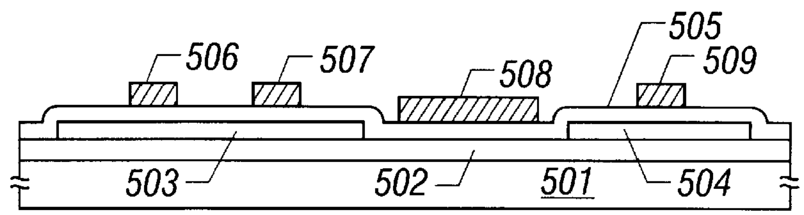
FIGS. 10A to 10F show a producing process according to an embodiment.
Figure 11A:
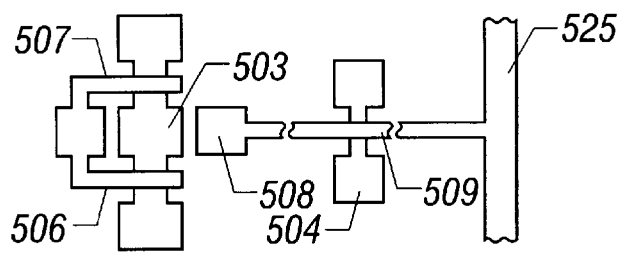
FIGS. 11A to 11E show a producing process according to an embodiment.

As in the above embodiments, after a glass substrate 501 is thermally annealed at 710° C. for 4 hours, a 2,000-Å-thick base silicon oxide film 502, island-like crystalline silicon regions 503 and 504, a 1,500-Å-thick silicon oxide film (as a gate insulating film), and gate electrodes 506, 507 and 509 and a gate line 508 which are made of aluminum (containing scandium at 0.2 weight %) are formed on the glass substrate 501. As in the fourth embodiment, aluminum oxide films (not shown) of 100 to 300 Å in thickness are formed on the upper surfaces of the gate electrodes 506, 507 and 509 and the gate line 508, to improve insulation performance. As shown in FIG. 11A, the gate line 508 and the gate electrode 509 are integral with each other, and are connected to a wiring 525 for anodization. (FIGS. 10A and 11A).

Figure 10B:
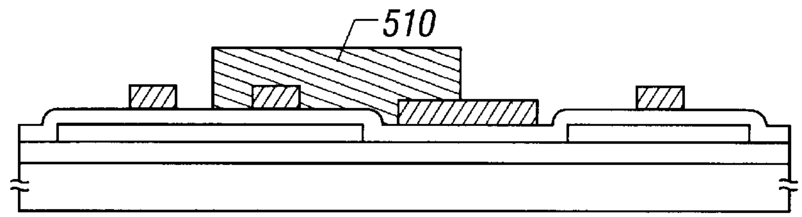

Then, a photoresist mask 510 is formed by a known photolithographic process. The mask 510 is used for not only doping of an N-type impurity but also selective anodization. Therefore, the mask 510 is formed so as to cover a portion of the gate line 508 where a contact to an upper wiring is formed. (FIG. 10B).

Figure 10C:
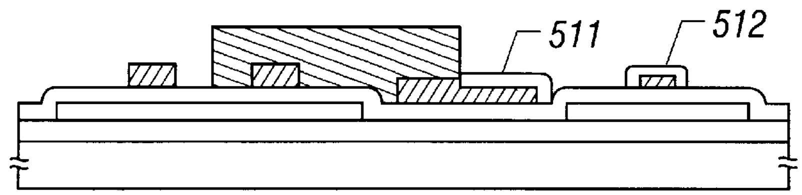
Figure 11B:
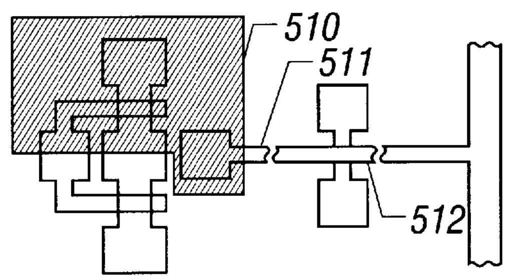

Then, as in the third embodiment, barrier type anodization is performed by causing a current to flow through the gate line 508 (i.e., a wiring 525 for anodization), so that 2,000-Å-thick dense, barrier-type anodic oxide films 511 and 512 are formed on the top and side surfaces of the gate line 508 and the gate electrode 509. Naturally no anodic oxide film is formed on the gate electrodes 506 and 507 of the TFTs of the peripheral logic circuit. (FIGS. 10C and 11B).

Figure 10D:
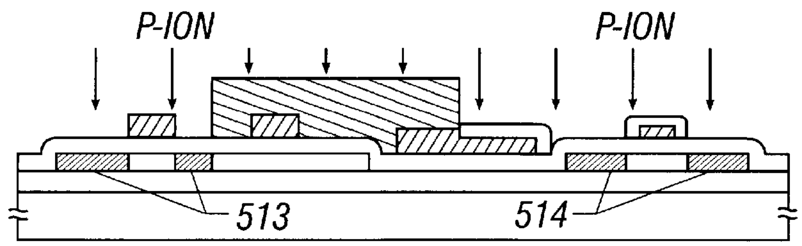

N-type impurity regions 513 and 514 are then formed by implanting an N-type impurity (phosphorus) into the active layers 503 and 504 by ion doping with the mask 510 left as it is. Doping conditions are the same as those in the third embodiment. (FIG. 10D).

Figure 10E:
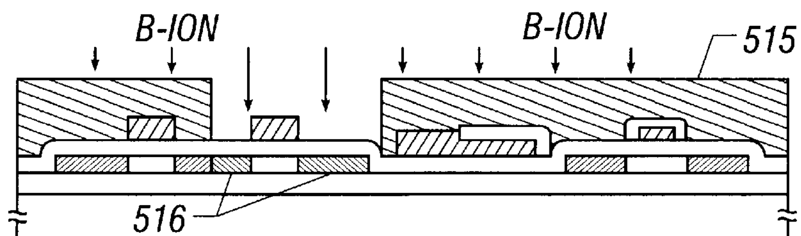
Figure 11C:
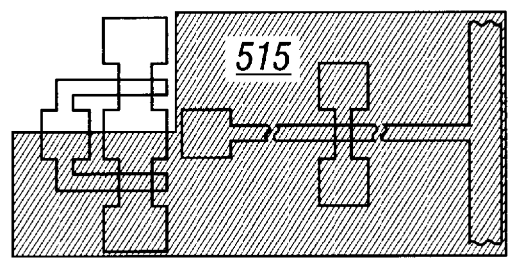

After a mask 515 for doping of a P-type impurity is formed, P-type impurity regions 516 are formed by implanting a P-type impurity (boron) into the active layer 503 also by ion doping. Doping conditions are the same as those in the third embodiment. If the doping conditions are so set that boron has a lower concentration than phosphorus, this doping can be performed without using the mask 515. (FIGS. 10E and 11C)

A 4,000-Å-thick silicon nitride film 517 as a first interlayer insulator is formed by plasma CVD. Contact holes are formed by wet-etching the silicon nitride film 517 using an etchant having the same composition as the etchant used in the third embodiment for the etching for separation. In this embodiment, since no anodic oxide film exists in the portion where a contact between the gate line 508 and an upper layer wiring is provided, an ordinary etching process and conditions are used. No deposition substances are found on the substrate surface.

A three-layer metal film of a 500-Å-thick titanium film, a 4,000-Å-thick aluminum film, and a 500-Å-thick titanium film is deposited by sputtering, and then etched first with ammonium hydrogen peroxide ((hydrogen peroxide):ammonia:water=5:2:2) at 40° C. and then with aluminum mixed acid (phosphoric acid, acetic acid, and nitric acid) at 35° C., to form electrode-wirings 518 to 522.

Figure 10F:
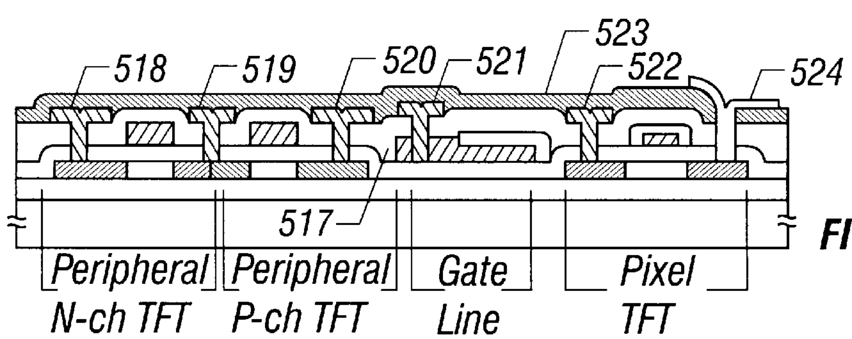
Figure 11D:
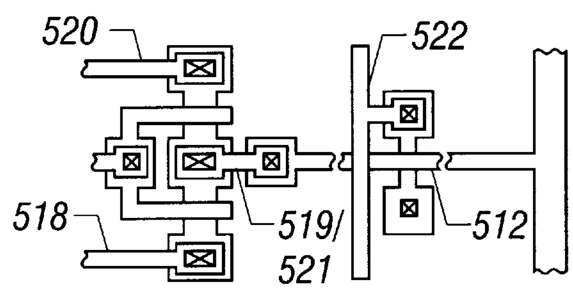
Figure 11E:
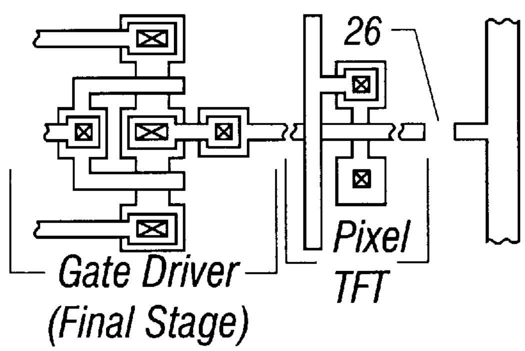
Figure 12:
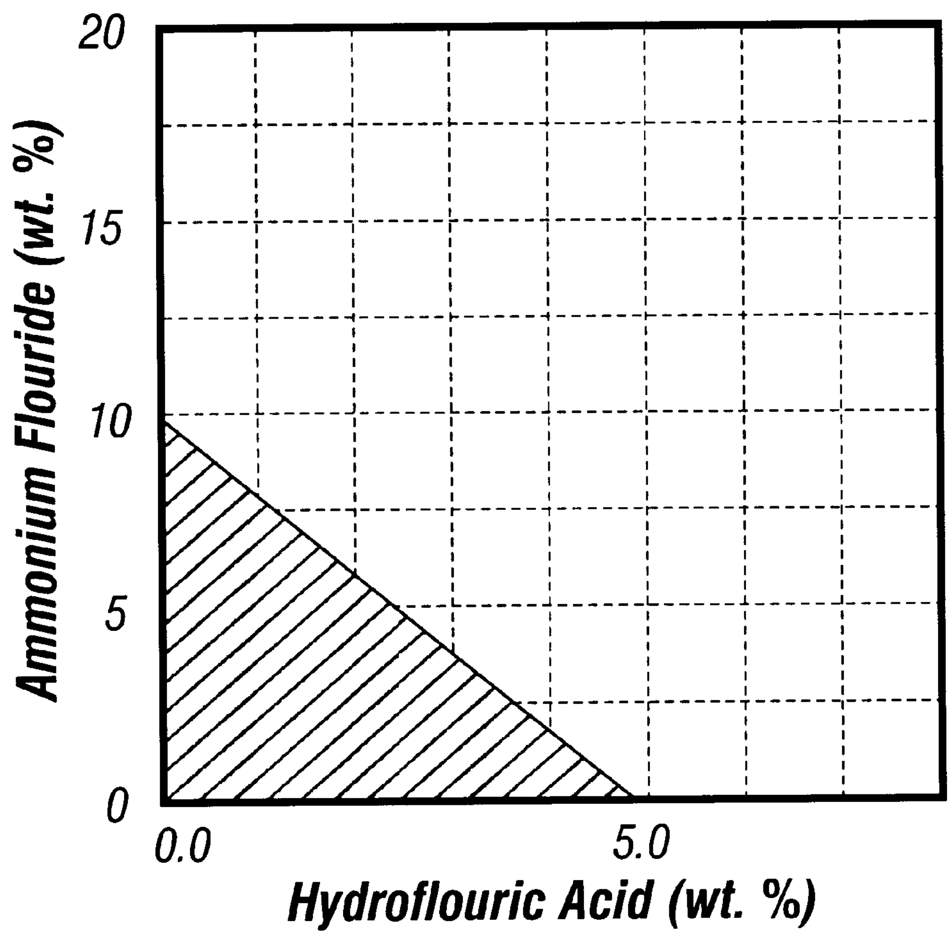
FIG. 12 shows a range in components of an etchant which represents a superior etching state in a case wherein alumina and the like is formed on a substrate containing a large amount of alumina and then etching is performed.

A 2,000-Å-thick silicon oxide film 523 as a second interlayer insulator is formed by plasma CVD. After a contact hole for the drain side electrode of the pixel TFT is formed by etching the silicon oxide film 523 with an etchant having the same composition as the etchant used in the third embodiment for the patterning for separation, a pixel electrode 524 made of ITO is formed. Thus, a monolithic active matrix circuit can be completed. (FIGS. 10F and 11D)

To prevent electrostatic breakdown in assembling a liquid crystal panel, the anodization wiring 525 and the gate line 508 are left connected to each other until the active matrix circuit is incorporated into the liquid crystal panel. The anodization wiring 525 and the gate line 508 are finally melt-separated from each other at a point 526 by irradiating a laser light (second harmonics of a Nd:YAG laser) while scanning it. The reason why laser light is used is that a mechanical means may cause static electricity. Thus, an active matrix circuit type liquid crystal panel is completed.

According to the invention, the use of chromic acid (pollution-causing substance) can be avoided, because BHF that is mainly composed of hydrofluoric acid and ammonium fluoride is used as an etchant (etching material) for etching aluminum or an oxide mainly made of aluminum.

The composition of the above etchant is so adjusted that the proportion of ammonium fluoride is kept low, there occurs no deposition of crystals as mentioned above and selective etching between an oxide and aluminum can be performed.

Further, aluminum or an oxide mainly made of aluminum that is formed on a glass substrate containing a large amount of alumina can be etched without deposition of crystals as mentioned above.

What is claimed is:

1. An etching material for removing an insulating film comprising aluminum oxide formed on wiring provided on a substrate, comprising:

an aqueous solution containing at least hydrofluoric acid at 0.49 to 2.0 weight % and ammonium fluoride at 0.19 to 2.0 weight %.

2. The material of claim 1 wherein the aqueous solution contains hydrofluoric acid, ammonium fluoride, and pure water at a volume ratio of n:n:100 where n is 0.5 to 5.

3. The material of claim 1 wherein the aqueous solution contains a surface active agent.

4. An etching method comprising the steps of:

forming an aluminum oxide layer on a surface of a material containing aluminum;

preparing an etching material comprising an aqueous solution containing at least hydrofluoric acid and ammonium fluoride at 0.49 to 2.0 weight % and 0.19 to 2.0 weight %, respectively; and etching the aluminum oxide layer using the etching material.

5. The method of claim 4 wherein the aqueous solution contains hydrofluoric acid, ammonium fluoride, and pure water at a volume ratio of n:n:100 where n is 0.5 to 5.

6. The method of claim 4 wherein the aqueous solution contains a surface active agent.

7. An etching material for removing an insulating film formed on wiring provided on a substrate, which includes aluminum oxide, comprising:

an aqueous solution containing hydrofluoric acid, ammonium fluoride and water at a weight ratio of x:y:(100−x−y) where x and y satisfy a relationship $$y<-2x+10(0<x\leqq 5,\ 0<y\leqq 10).$$

8. The material of claim 7 wherein the aqueous solution contains a surface active agent.

9. An etching method comprising the steps of:

forming a material containing aluminum on a substrate containing aluminum oxide;

forming an aluminum oxide layer on a surface of the material containing aluminum;

preparing an etching material comprising an aqueous solution containing at least hydrofluoric acid and ammonium fluoride at 0.49 to 2.0 weight % and 0.19 to 2.0 weight %, respectively; and etching the aluminum oxide layer using the etching material.

10. The method of claim 9 wherein the aqueous solution contains a surface active agent.

11. A method of manufacturing an electronic device comprising:

forming a wiring comprising aluminum formed over a substrate;

oxidizing a surface of said wiring to form an aluminum oxide film on said surface to form an oxidizing surface;

providing a photoresist mask over the wiring having the oxidized surface wherein a portion of the oxidized surface is exposed from said photoresist mask; and removing a portion of the aluminum oxide film in accordance with the photoresist mask by using an aqueous solution containing hydrofluoric acid at 0.49 to 2.0 weight percent and ammonium fluoride at 0.19 to 2.0 weight percent.

12. A method according to claim 11 wherein said substrate contains aluminum oxide.

* * * * *